(12) United States Patent
Fried et al.

(10) Patent No.: US 6,800,905 B2
(45) Date of Patent: Oct. 5, 2004

(54) IMPLANTED ASYMMETRIC DOPED POLYSILICON GATE FINFET

(75) Inventors: David M. Fried, Williston, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,328

(22) Filed: Dec. 14, 2001

(65) Prior Publication Data

US 2003/0113970 A1 Jun. 19, 2003

(51) Int. Cl.[7] ............................................... H01L 27/01
(52) U.S. Cl. ...................... 257/351; 257/365; 257/369
(58) Field of Search ................................ 257/206, 328, 257/361, 365, 369, 401, 523, 619, 618, 623, 754–7, 767

(56) References Cited

U.S. PATENT DOCUMENTS

| | | | |
|---|---|---|---|
| 3,872,491 A | | 3/1975 | Hanson et al. |
| 5,315,143 A | | 5/1994 | Tsuji |
| 5,338,959 A | | 8/1994 | Kim et al. |
| 5,365,083 A | | 11/1994 | Tada |
| 5,391,506 A | | 2/1995 | Tada et al. |
| 5,872,045 A | * | 2/1999 | Lou et al. .................... 438/432 |
| 6,031,269 A | | 2/2000 | Liu |
| 6,069,390 A | | 5/2000 | Hsu et al. |
| 6,150,687 A | | 11/2000 | Noble et al. |
| 6,207,530 B1 | | 3/2001 | Hsu et al. |
| 6,207,985 B1 | | 3/2001 | Walker |
| 6,242,783 B1 | | 6/2001 | Ohmi et al. |
| 6,503,784 B1 | * | 1/2003 | Enders et al. ................ 438/199 |

OTHER PUBLICATIONS

Leland Chang, et al., "Gate Length Scaling and Threshold Voltage Control of Double–Gate MOSFET's", Department of Electrical Engineering and Computer Sciences, University of California, 2000 IEEE.
Keunwoo Kim, et al., Optimal Double–Gate MOSFET's : Symmetrical or Asymmetrical Gates?, 1999 IEEE International SOI Conference, Oct. 1999, (pp. 98–99).
Yan, et al., Scaling the Si MOSFET : From Bulk to SOI Bulk, IEEE Transactions on Electron Devices, vol. 39, No. 7, p. 1704, Jul. 1992.

* cited by examiner

Primary Examiner—Wael Fahmy
Assistant Examiner—Ginette Peralta
(74) Attorney, Agent, or Firm—Scully, Scott, Murphy & Presser; Anthony Canale

(57) ABSTRACT

An asymmetric field effect transistor (FET) that has a threshold voltage that is compatible with current CMOS circuit designs and a low-resistance gate electrode is provided. Specifically, the asymmetric FET includes a p-type gate portion and an n-type gate portion on a vertical semiconductor body; an interconnect between the p-type gate portion and the n-type gate portion; and a planarizing structure above the interconnect.

14 Claims, 9 Drawing Sheets

IMPLANTED ASYMMETRIC DOPED POLYSILICON GATE FINFET

CROSS REFERENCE TO RELATED APPLICATIONS

Reference is made to co-pending U.S. patent application Ser. No. 09/683,316 entitled "Doubly Asymmetric Double Gate Transistor and Method for Forming."

BACKGROUND OF THE INVENTION

The present invention relates to semiconductor devices, and more particularly to an implanted asymmetric doped polysilicon-containing gate FinFET structure that is integrated with a thick polysilicon-containing gate. The present invention is also directed to a method to integrate the implanted asymmetric polysilicon-containing gate FinFET with a thick polysilicon-containing gate for manufacturing integration.

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects.

To scale down MOSFET channel lengths without excessive short-channel effects, gate oxide thickness is typically reduced while increasing channel-doping concentration. However, Yan, et al., "Scaling the Si MOSFET: From bulk to SOI to bulk", IEEE Trans. Elect. Dev., Vol. 39, p. 1704, July 1992, have shown that to reduce short-channel effects for sub-0.05 Å-m MOSFETs, it is important to have a backside-conducting layer present in the structure that screens the drain field away from the channel. The Yan, et al. results show that double-gated MOSFETs and MOSFETs with a top gate and a backside ground plane are more immune to short-channel effects and hence can be scaled to shorter dimensions than conventional MOSFETs.

The structure of a typical prior art double-gated MOSFET consists of a very thin vertical Si layer (fin) for the channel and the source/drain diffusions, with two gates, one on each vertical side of the channel. The term "Fin" is used herein to denote a semiconducting material which is employed as the body of the FET; the term "FinFET" refers to an FET with a fin body. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

One problem with prior art structures which comprise symmetric polysilicon gates on a FinFET is that the symmetric polysilicon gate FinFET structure will result in threshold voltages that are not compatible with existing CMOS circuit designs. For example, the NFET threshold voltage will be negative and the PFET will be quite positive. A potential solution to this problem is using a symmetric metal gate. Integration and processing difficulty has, however, made the development of a metal gate FinFET quite slow.

Another possible solution is an asymmetric doped polysilicon gate where one side of the Fin (i.e., thin film semiconducting layer) includes an N+ doped polysilicon gate and the other side of the Fin includes a P+ doped polysilicon gate. This asymmetry will shift threshold voltages to CMOS compatible levels in planar double-gate devices as well as FinFETs. However, in prior art asymmetric polysilicon gate structures thin polysilicon gates are employed. A problem with such structures is that thin polysilicon gates result in highly resistive gate electrodes. Additionally, the aspect ratio of the structures having thin gate electrodes makes the gate etch extremely difficult.

In view of the above-mentioned problems, there is a continued need for developing a new and improved FinFET structure in which the threshold voltage is compatible with current CMOS circuit designs and where low-resistance gate electrodes are realized.

BRIEF SUMMARY OF THE INVENTION

One object of the present invention is to provide a FinFET structure containing asymmetric polysilicon-containing gates which make the threshold voltage of the structure compatible with current CMOS circuit designs. The term "polysilicon-containing" is used herein to denote materials that are comprised of polySi or polySiGe.

Another object of the present invention is to provide an asymmetric FinFET structure wherein low-resistance gate electrodes are employed.

A still further object of the present invention is to provide an asymmetric FinFET structure in which the asymmetric polysilicon-containing gates are interconnected by an interconnect layer.

A yet further object of the present invention is to provide an asymmetric FinFET structure wherein a planarizing structure is present atop the asymmetric FinFET structure.

These and other objects and advantages are achieved in the present invention by providing a structure where an implanted asymmetric polysilicon-containing gate FinFET is integrated with a thick polysilicon-containing outer gate electrode (i.e., the planarizing structure). The integrated FinFET/thick polysilicon-containing gate structure allows for the production of a FinFET in which the threshold voltage is compatible with current CMOS circuit designs, and the resistivities of the gate electrodes are lower than conventional symmetric FinFETs.

One aspect of the present invention relates to a method of forming a plurality of conductive structures on a substrate. Specifically, the inventive method includes the steps of:

forming a first semiconductor structure of a first conductivity type, a second semiconductor structure of a second conductivity type, and a third semiconductor structure on a substrate, said third semiconductor structure being disposed between said first and second semiconductor structures and being separated therefrom by an insulator structure;

depositing an interconnect layer over at least said first, second and third semiconductor structures;

forming a planarizing conductor on said interconnect layer, said planarizing conductor having etch characteristics similar to those of said interconnect layer and said first and second semiconductor structures, but different from those of said insulator structure; and patterning and etching said planarizing conductor, said interconnect layer, and said first and second semiconductor structures so that each has at least one lateral dimension that is substantially the same.

Another aspect of the present invention relates to an asymmetric field effect transistor (FET) which includes:

a p-type gate portion and an n-type gate portion on a vertical semiconductor body;

an interconnect between said p-type gate portion and said n-type gate portion; and a planarizing structure above said interconnect.

DETAILED DESCRIPTION OF THE INVENTION

Figure 1A:
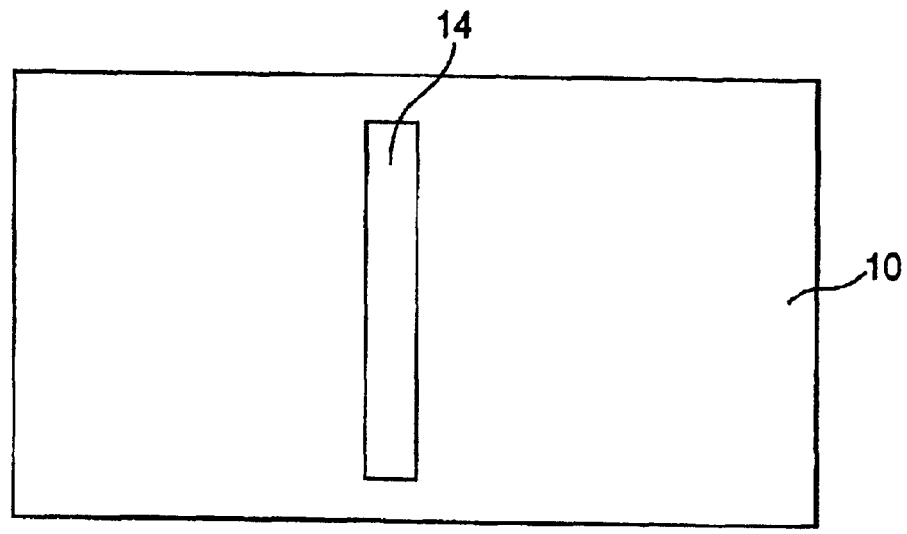
FIGS. 1–9 are pictorial representations (including A: top view; and B: cross-sectional view) showing the various processing steps employed in fabricating the inventive asymmetric FET structure.

The present invention, which provides an asymmetric FET structure and method of fabricating the same, will now be described in greater detail by referring to the drawings that accompany the present application.

Reference is first made to the initial structure shown in FIGS. 1A (top view) and 1B (cross-sectional view) which is employed in the present invention in fabricating the implanted asymmetric doped polysilicon-containing gate FinFET structure. Specifically, FIGS. 1A and 1B show a structure that includes substrate 10 having a patterned stack comprising a semiconductor body region, i.e., Fin, 12, and hard mask 14 present atop substrate 10.

The substrate includes upper portion 10$u$ which is comprised of an insulating material such as an oxide, nitride, oxynitride or multilayers thereof, and bottom portion 10$b$ which is comprised of a semiconducting material such as Si. Note that regions 10 and 12 may be part of an SOI (silicon-on-insulator) material wherein region 10$u$ is a buried oxide layer which is sandwiched between semiconducting materials 10$b$ and 12. Alternatively, layers 10$u$ and 12 are layers which are separately deposited atop a semiconductor substrate.

The semiconductor body region, i.e., Fin region 12, is comprised of any semiconducting material such as single crystalline Si and the hard mask is comprised of an oxide, nitride, oxynitride or multilayers thereof. The vertical thicknesses of semiconducting material layer 12 (i.e., Fin 12) and the hard mask are not critical to the present invention. Typically, semiconducting material layer 12 has a vertical thickness of from about 300 to about 2000 Å . . . , whereas the hard mask has a vertical thickness of from about 100 to about 1000 Å . . . .

Figure 1B:
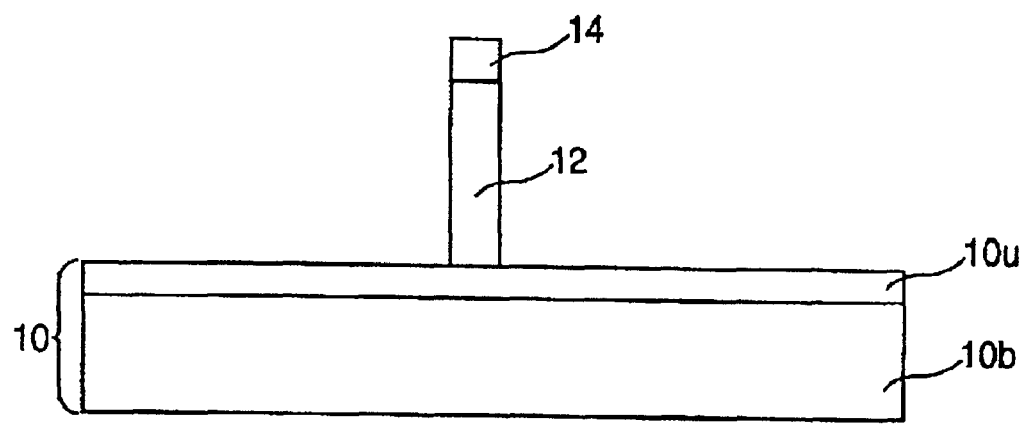

The structure shown in FIGS. 1A–1B is fabricated utilizing conventional processes well known to those skilled in the art. For example, hard mask 14 is formed atop a layer of semiconducting material by utilizing a conventional deposition process such as chemical vapor deposition (CVD), plasma-assisted CVD, or chemical solution deposition. Alternatively, hard mask 14 may be grown on semiconducting material layer 12 (i.e., Fin 12) utilizing a conventional thermal oxidation, nitridation or oxynitridation process well known to those skilled in the art.

Following formation of the hard mask material on semiconducting material layer 12, the structure is subjected to conventional lithography (including applying a photoresist to the hard mask, exposing the photoresist to a pattern of radiation, and developing the pattern into the photoresist using a conventional resist developer) and dry etching such as reactive-ion etching, ion beam etching, plasma-etching or laser ablation. The etching step may include a single etching process or multiple etching processes using one or more of the above mentioned dry etching processes may be employed to provide the structure illustrated in FIGS. 1A–1B. After etching, the photoresist is removed from the structure utilizing a conventional stripping process well known to those skilled in the art.

Figure 2A:
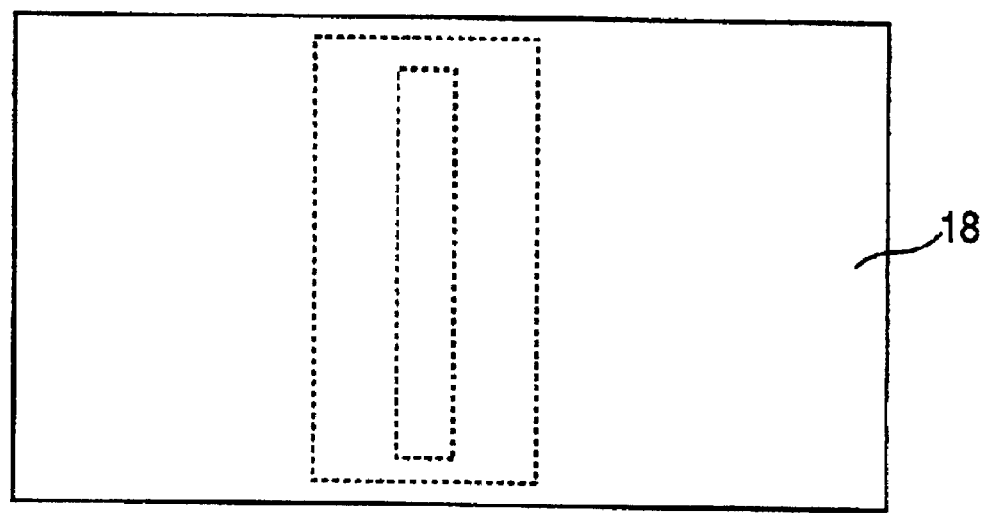
Figure 2B:
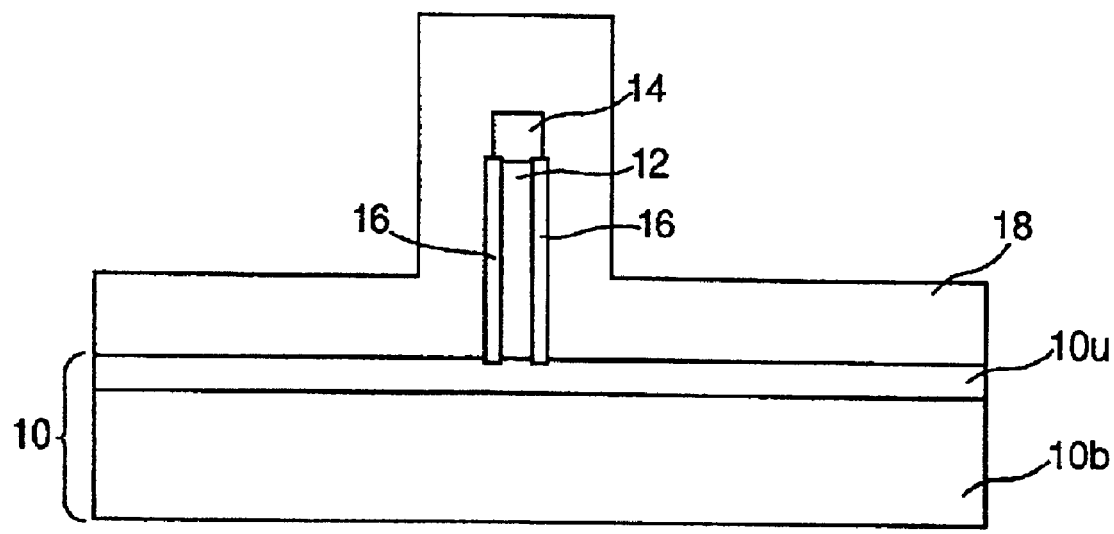

Next, the structure shown in FIGS. 1A–1B is then subjected to a conventional oxidation, nitridation or oxynitridation process which is capable of forming gate dielectric 16 on exposed sidewalls of Fin layer 12. Following formation of the gate dielectric on the exposed sidewalls of Fin 12, thin polysilicon-containing layer 18 is formed over the entire surface of the structure utilizing a conventional deposition process such as CVD providing the structure shown in FIGS. 2A–2B. The term "polysilicon-containing" is used herein to denotes a layer that is comprised of poly-crystalline silicon or a poly-crystalline alloy of silicon and germanium. In one preferred embodiment of the present invention, the polysilicon-containing layer 18 is comprised of polySi. Polysilicon-containing layer 18 is a thin layer whose thickness is significantly thinner than the height of the Fin to provide the appropriate shadow angles required in the subsequent angled implant step. In the present invention, Fin 12 typically has a height from about 300 to about 2000 Å . . . and polysilicon-containing layer 18 has a thickness of from about 150 to about 1000 Å . . . . More preferably, Fin 12 has a height from about 900 to about 1200 Å . . . and polysilicon-containing layer 18 has a thickness of from about 500 to about 800 Å . . . .

It is noted that Fin region 12 represents a third semiconductor structure which is surrounded by insulating structure (layers 10$u$, 14, and 16) of the inventive asymmetric FinFET structure.

Figure 3A:
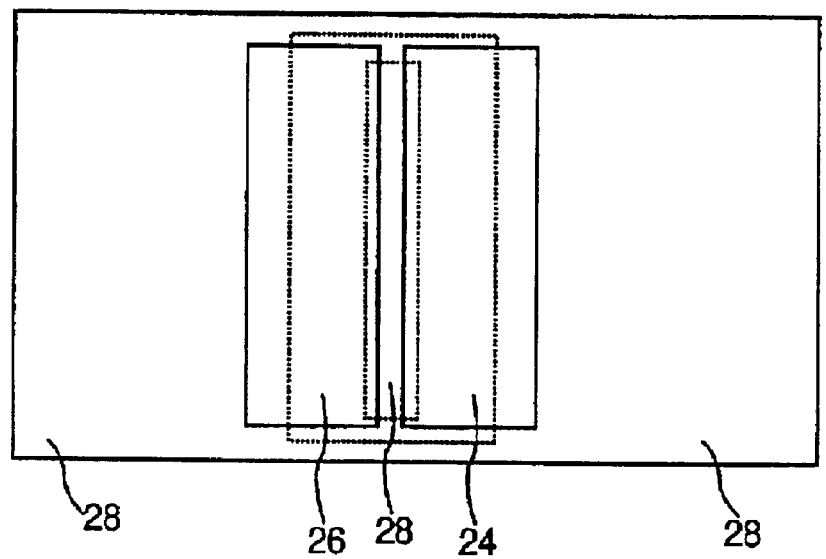
Figure 3B:
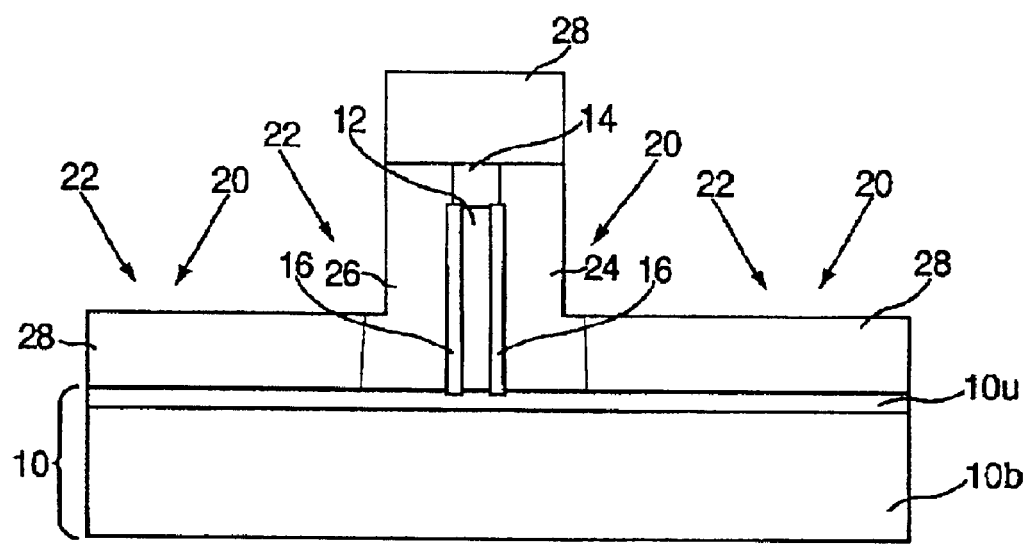

Next, and as shown in FIGS. 3A–3B, asymmetric implants are performed which are capable of forming first semiconductor structure 24 of a first conductivity type (e.g., N+ implant region or n-type gate portion) on one side of Fin 12 and second semiconductor structure 26 of a second conductivity type (e.g., P+ implant region or p-type gate portion) on the other side of Fin 12. Specifically, an n-type dopant 20 and a p-type dopant 22 are implanted into polysilicon-containing layer 18 using a double angled implant process which is capable of forming implant regions having a final dopant concentration on the order of from about $1 \times 10^{19}$ to about $1 \times 10^{21}$ atoms/cm$^3$. Due to the shadowing of the structure, the gate sides (i.e., vertical portions of polysilicon-containing layer 18) remain doped (either N+ or P+) with the species implanted from that side, while the horizontal portions of polysilicon-containing layer 18 are counterdoped, i.e., double implanted, such that those areas are not doped N+ or P+. The double implant regions are labeled as 28 in FIGS. 3A–3B.

Figure 4A:
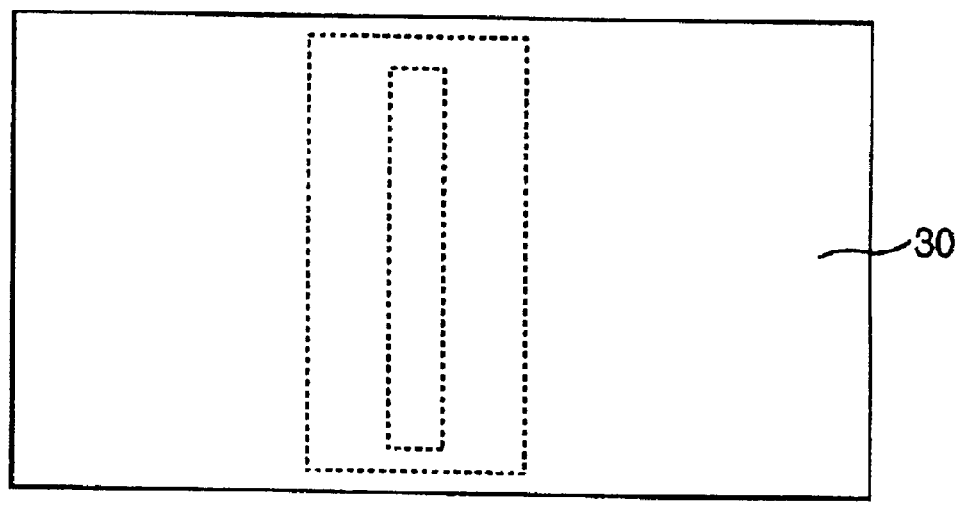
Figure 4B:
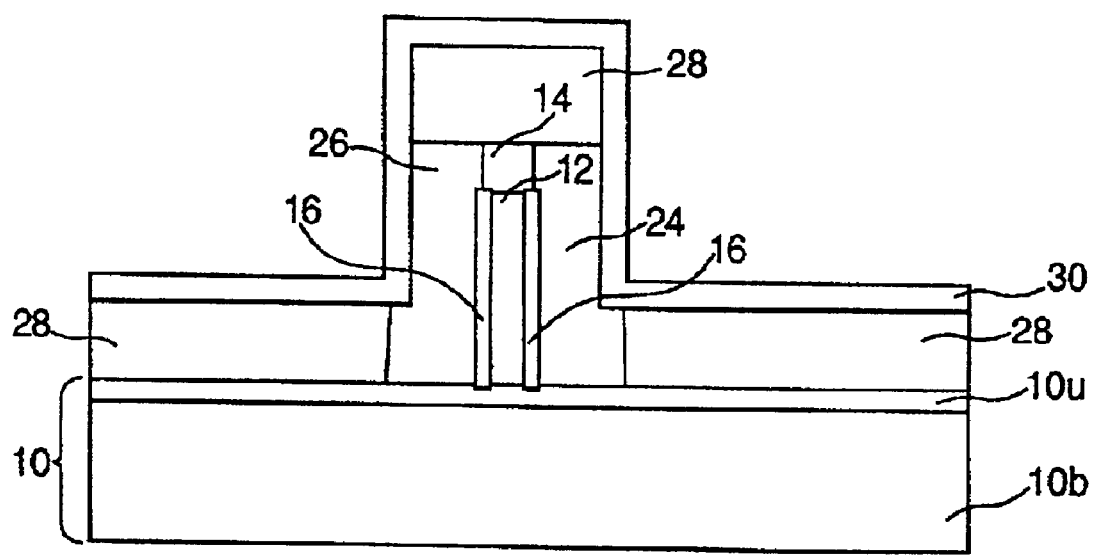

Following the asymmetric implant process described above, metallic layer 30 is formed atop all exposed surfaces shown in FIGS. 3A–3B so as to provide the structure illustrated, for example, in FIGS. 4A–4B. The metallic layer, which is formed utilizing a conventional deposition process such as CVD, sputtering or plasma-assisted CVD, has a thickness of from about 20 to about 1000 Å . . . , with a thickness of from about 100 to about 500 Å . . . being more highly preferred. The metallic layer formed at this point of the inventive method may comprise any conductive metal or metal alloy such as, but not limited to: W, TiN, and Ta. Note that metallic layer 30 contacts both gate regions, i.e., regions 24 and 26, hence metallic layer 30 is referred herein as an interconnect layer. In some embodiments of the present invention, the metallic layer may be transferred into a metallic silicide at this point of the inventive process. The transformation is carried out using a conventional annealing process well known to those skilled in the art (including, for example, the annealing conditions mentioned hereinbelow). In yet another embodiment, which is described hereinbelow, the transformation annealing occurs later in the inventive process at the same time as activation of the source and drain regions. In still another embodiment of the present invention, the metallic layer is not converted into a metallic silicide layer.

Figure 5A:
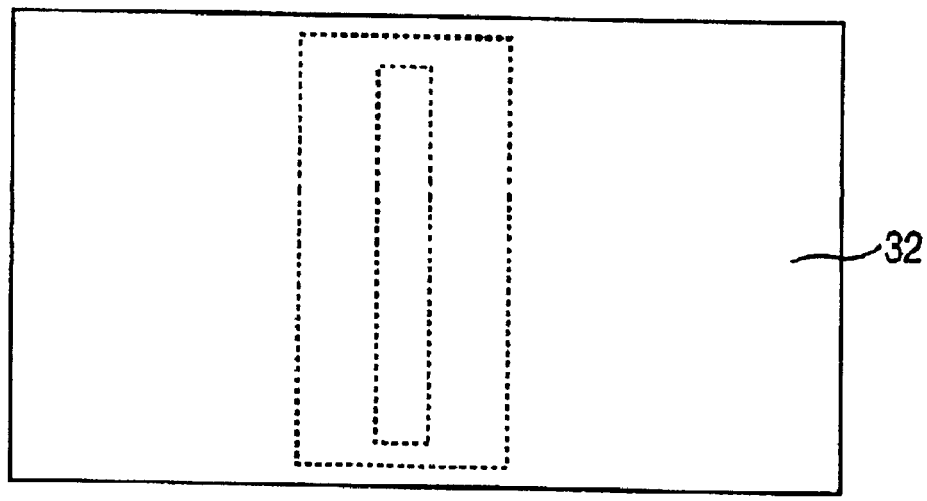
Figure 5B:
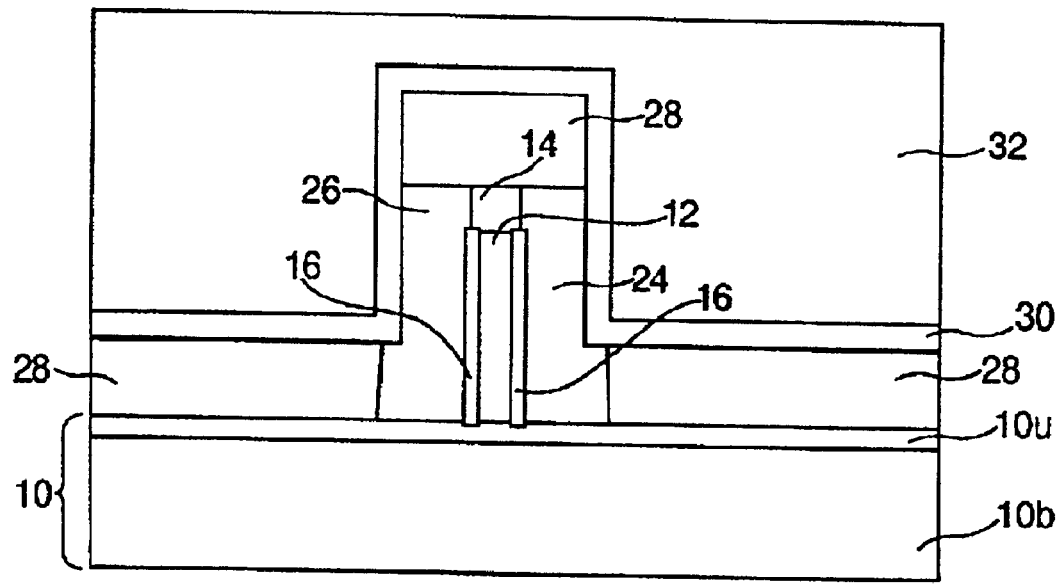

After forming the metallic layer on the structure so as to interconnect the first and second semiconductor structures to each other, a planarizing polysilicon-containing layer (or other conductive material such as a conductive metal or metal alloy) 32 is formed atop metallic layer 30 so as to provide the structure shown in FIGS. 5A–5B. Specifically, a thick polysilicon-containing layer composed of poly-crystalline silicon or a poly-crystalline alloy of silicon and germanium is formed by a conventional deposition process and thereafter the thick polysilicon-containing layer is planarized by a conventional planarization process such as chemical-mechanical polishing (CMP). The term "thick polysilicon-containing layer" denotes a polysilicon-containing layer having a thickness of from about 500 to about 2000 Å . . . , with a thickness of from about 800 to about 1500 Å . . . being more preferred. It is noted that the planar conductor formed at this point of the inventive process has etch characteristics similar to those of metallic interconnect layer 30 and the first and second semiconductor structures (regions 24 and 26), yet different from those of insulating structure.

Figure 6A:
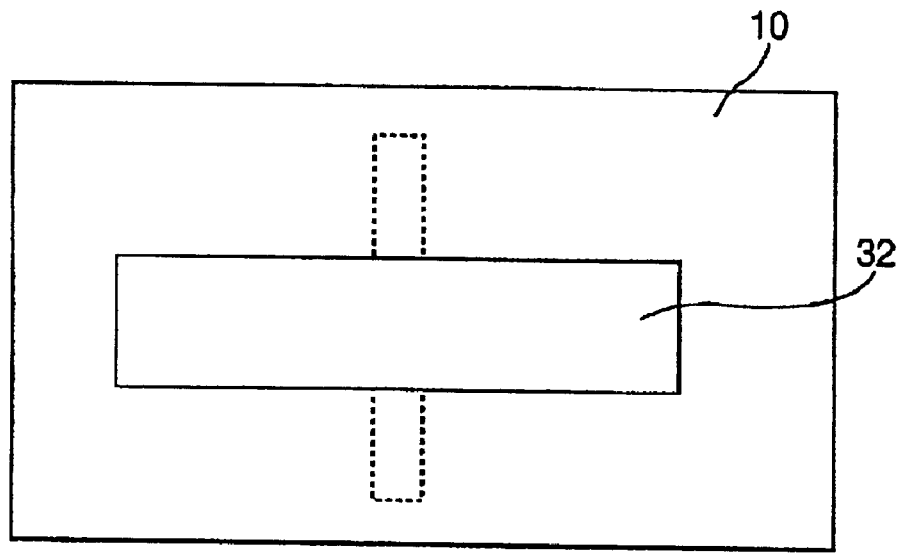
Figure 6B:
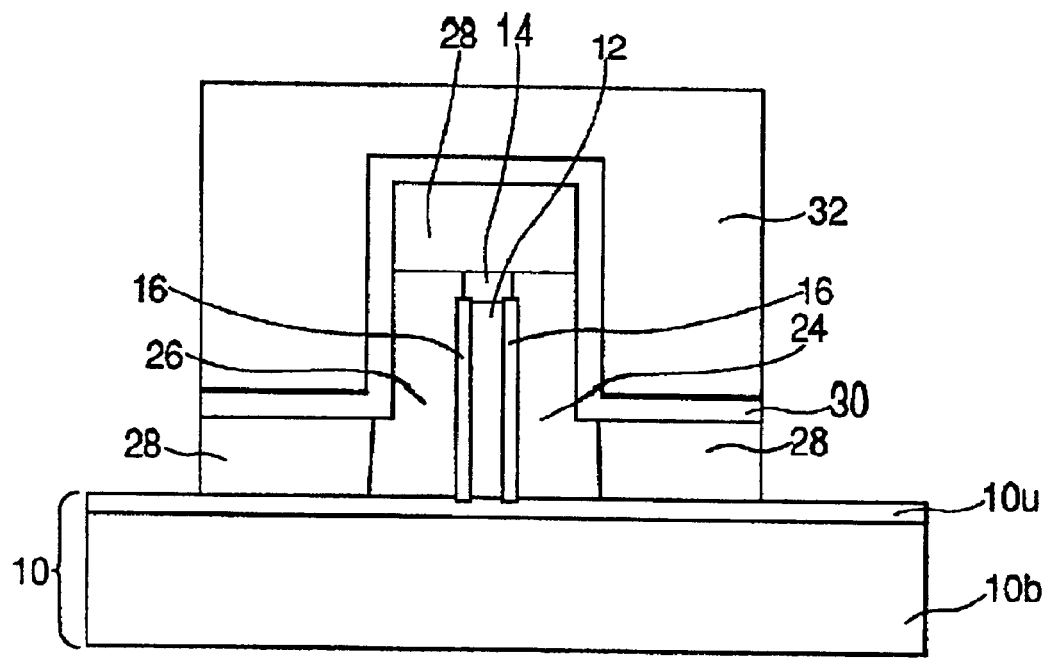

Conventional patterning (i.e., lithography) and etching are then performed so as to provide the structure shown in FIGS. 6A–6B. Note that portions of planarizing conductor 32, metallic interconnect 30, first and second semiconductor structures 24 and 26, respectively, are patterned and etched such that those regions have at least one lateral dimension that is substantially the same. That is, this etching step is capable of etching the above layers such that each of the etched layers has the same final shape.

Next, a conventional implantation process is performed so as to form source/drain implant regions 33 in the structure in areas adjacent to the Fin region; See FIGS. 7A–7B. Note that during this implant process, polysilicon-containing layer 32 is converted into doped polysilicon-containing layer 34, but metallic layer 30 serves as a diffusion barrier preventing dopant from being implanted into the oppositely doped polysilicon-containing gate regions. The doping at this point may be either n or p-type. In one embodiment of the present invention the exposed areas adjacent to Fin 12 are doped using different implant species such as As and B so as to form source/drain regions 33 which have donor or acceptor impurities, respectively.

Figure 7A:
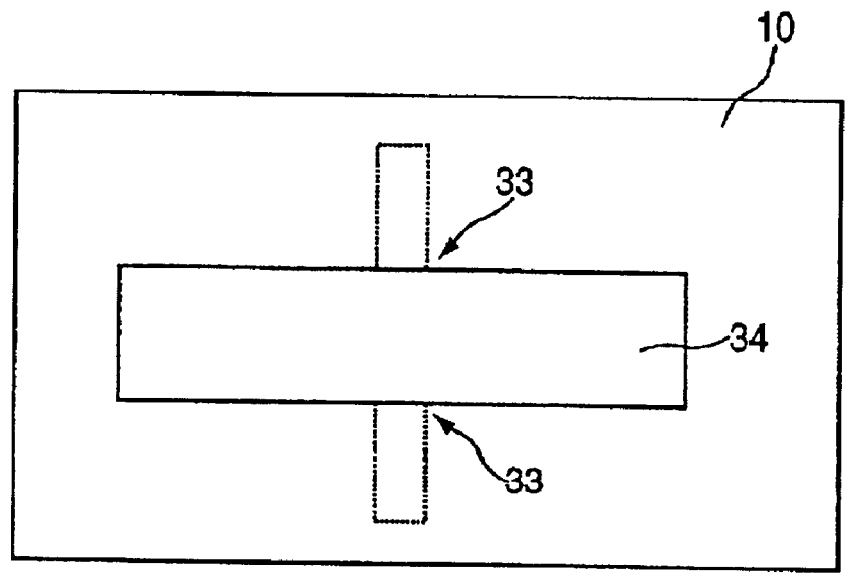
Figure 7B:
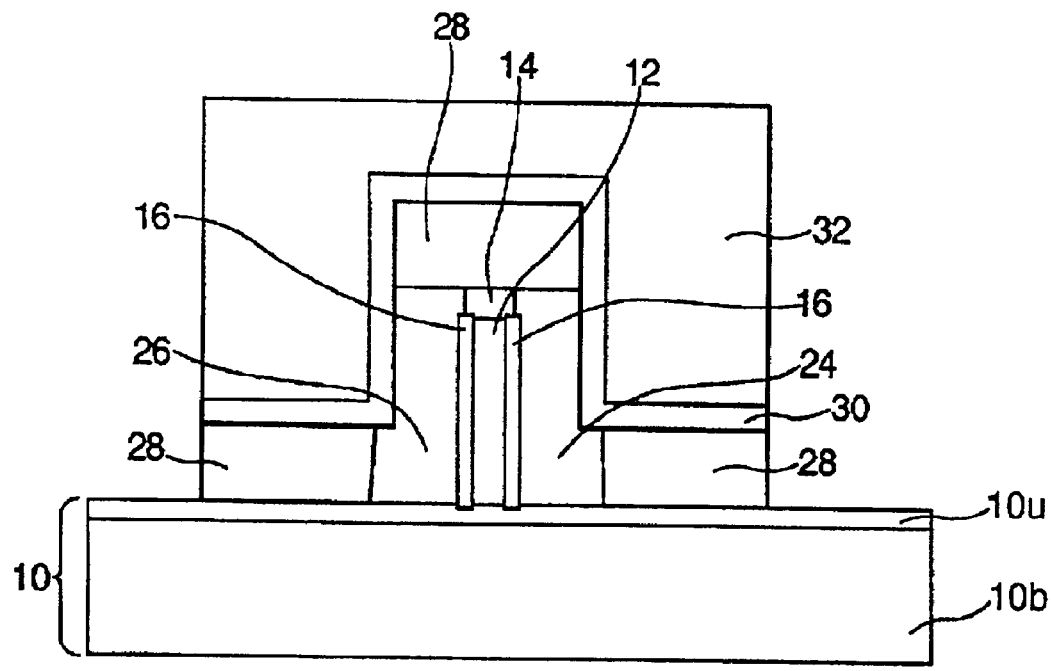
Figure 8A:
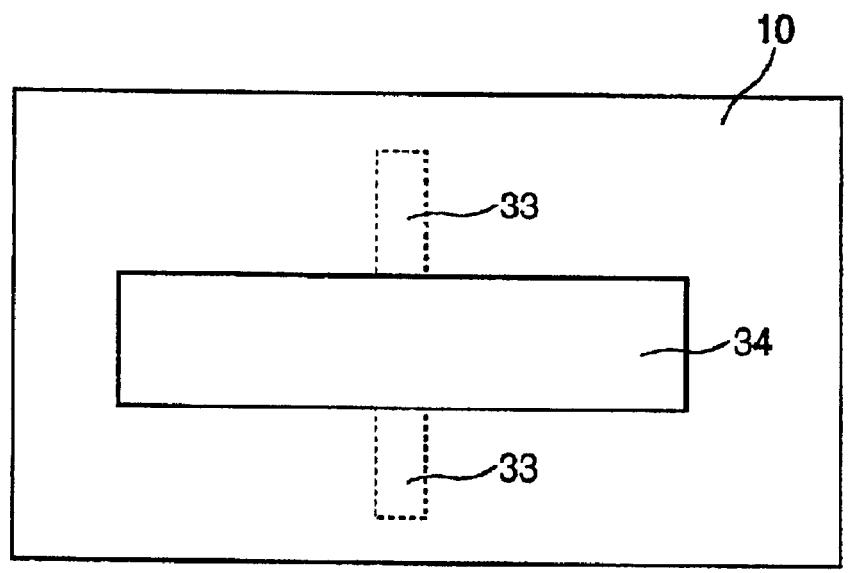
Figure 8B:
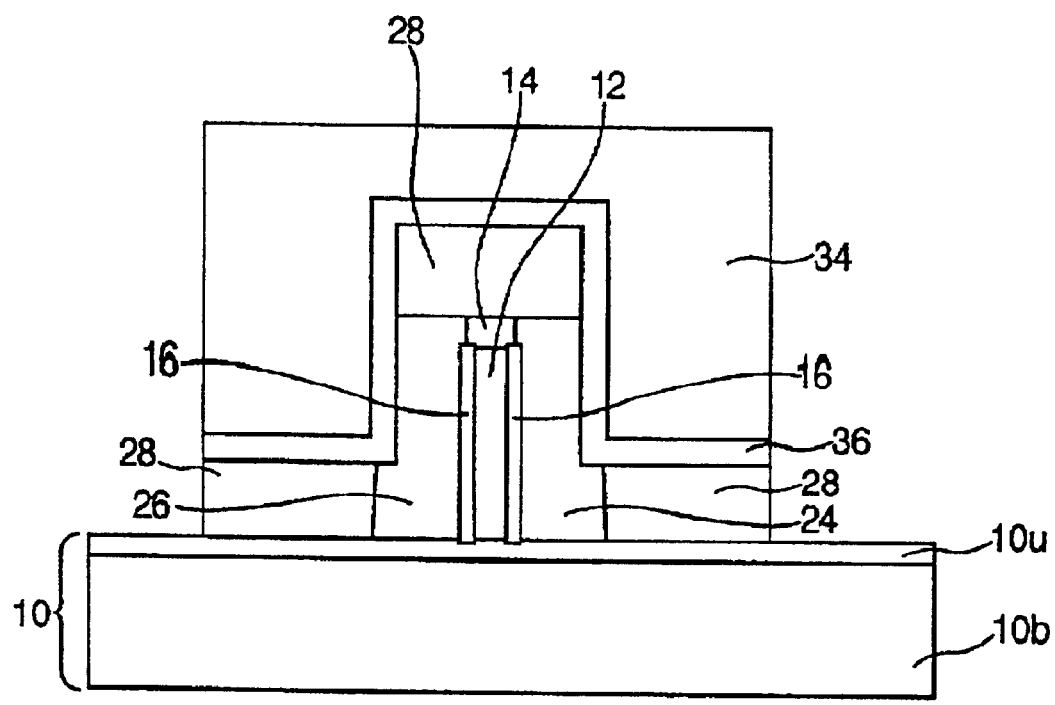

Following formation of the structure shown in FIGS. 7A–7B, that structure is subjected to an activation annealing process which is capable of activating the source/drain regions as well as converting the metallic interconnect layer into metallic silicide (or metallic nitride—most generally, this material must have the electronic properties of a metal, or a semi-metal) layer 36 which bridges the two polysilicon-containing layers. This eliminates the pn junction in the gate and provides a contact between the top doped polysilicon-containing layer, i.e., layer 34, and the gate electrodes (i,e., double implanted polysilicon-containing regions 28). The resultant structure after performing the activation annealing step is shown, for example, in FIGS. 8A–8B.

Specifically, activation annealing is carried out at a temperature of about 700 Å° C. or higher in the presence of an inert gas atmosphere such as He, N2, Ar, Xe and Kr, that may be optionally admixed with H2. More preferably, the activation annealing is performed at a temperature of from about 850 Å° to about 1000 Å° C. in the presence of He or Ar.

Figure 9A:
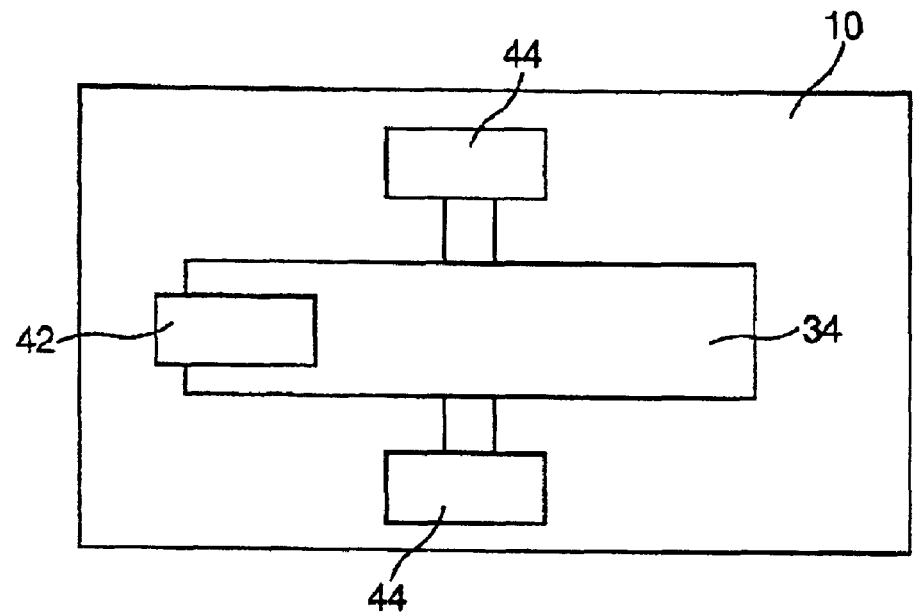
Figure 9B:
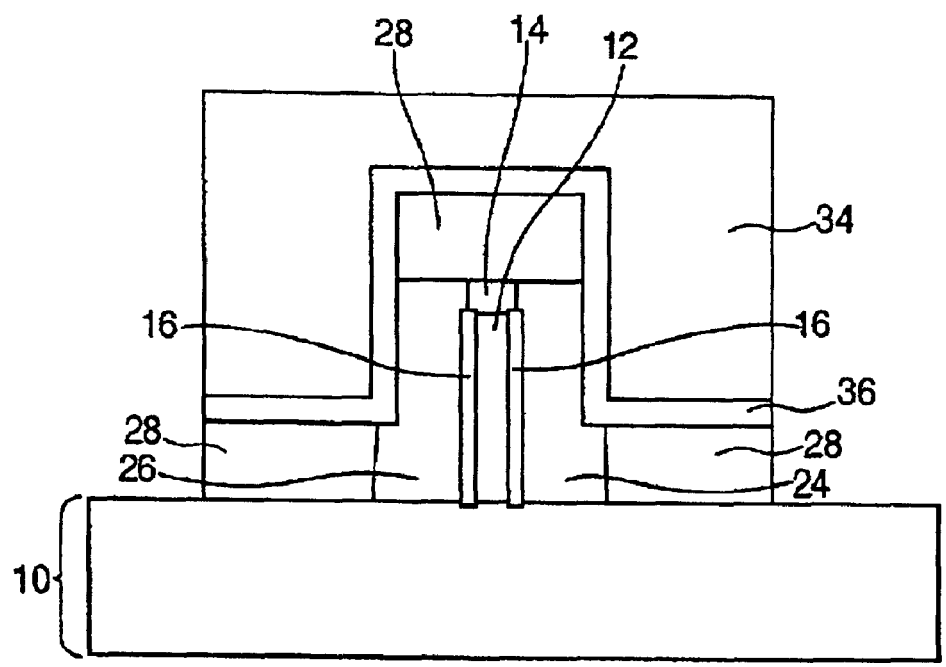

Following the activation annealing step, standard FinFET finishing processing steps including formation of gate contact 42, and source/drain contacts 44, are performed providing the structure shown in FIGS. 9A–9B.

In some embodiments of the present invention, double implanted gate regions 28 and doped region 34 are composed of a semiconducting material instead of a polysilicon-containing material. Moreover, although the invention has been described with reference to a FinFET, in practice any vertically-extending semiconductor body could be used, so long as the channel region thereof is capable of being controlled by a plurality of gates.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. An asymmetric field effect transistor (FET) comprising:
a patterned stack including at least a vertical semiconductor body having sidewalls located on an upper non-recessed surface of an insulator that is located on a substrate;
a gate dielectric located on each sidewall of said vertical semiconductor body,
a p-type gate portion located on one side of the vertical semiconductor body and an n-type gate portion located on an opposing side of the vertical semiconductor body, said gate portions together with said vertical semiconductor body forming a single asymmetric FET device that is located on said lapper surface of the insulator;
a double implanted region located adjacent to each of said gate portions and on said insulator;
An interconnect located at least over said p-type gate portion and said n-type gate portion; and
a planarizing structure above said interconnect.

2. The asymmetric FET of claim 1 wherein said p-type get portion, said n-type gate portion and said planarizing structure are composed of a polySi-containing material or a semiconducting material.

3. The asymmetric FET structure of claim 2 wherein said polySi-containing material comprises polySi or polySiGe.

4. The asymmetric FET of claim 1 wherein said interconnect is highly resistant to dopant diffusion.

5. The asymmetric FET of claim 1 wherein said interconnect is a conductive metal, metal silicide or metal nitride.

6. The asymmetric FET of claim 1 wherein said planarizing structure is doped polysilicon.

7. The asymmetric FET of claim 1 wherein said vertical semiconductor body has a hard mask present on an upper surface.

8. The asymmetric FET of claim 7 wherein said hard mask is comprised of an oxide, nitride, oxynitride or multilayers thereof.

9. The asymmetric FET of claim 1, wherein said n-type gate portion is comprised of N-doped polysilicon and said p-type gate portion is comprised of P-type polysilicon.

10. The asymmetric FET of claim 1 wherein said vertical semiconductor body and said substrate are components of a silicon-on-insulator material.

11. The asymmetric FET of claim 1 wherein said planarizing material is a metal or metal alloy.

12. The asymmetric FET of claim 1 wherein further comprising source/drain regions in areas adjacent to the vertical semiconductor body.

13. The asymmetric FET of claim 12 wherein said source/drain regions are doped so as to have either donor or acceptor impurities.

14. An asymmetric field effect transistor (FET) comprising:

a patterned stack including at least a vertical single crystal Si semiconductor body having sidewalls located on an upper non-recessed surface of an insulator that is located on a substrate;

a gate dielectric located on each sidewall of said vertical single crystal Si semiconductor body;

a p-type gate portion located on one side of the vertical single crystal Si semiconductor body and an n-type gate portion located on an opposing side of the vertical single crystal Si semiconductor body, said p-type and n-type gate portions are composed of polysilicon, and said gate portions together with said vertical single crystal Si semiconductor body forming a single asymmetric FET device that is located on said upper surface of the insulator;

a double implanted region located adjacent to each of said gate portions and on said insulator;

a metal silicide interconnect located at least over said p-type gate portion and said n-type gate portion; and a planarizing doped polysilicon layer above said interconnect.

* * * * *

UNITED STATES PATENT AND TRADEMARK OFFICE
CERTIFICATE OF CORRECTION

PATENT NO. : 6,800,905 B2
DATED : October 5, 2004
INVENTOR(S) : David M. Fried, Edward J. Nowak and Jed H. Rankin It is certified that error appears in the above-identified patent and that said Letters Patent is hereby corrected as shown below:

Column 6,
Line 2, "700 Â° C." should read -- 700°C --;
Line 6, cancel the text "about 850 Â° to about 1000 Â° C." and insert the following text -- about 850°C to about 1000°C --;
Line 41, "lapper" should read -- upper --;
Line 47, "get" should read -- gate --;
Line 52, "polySiGc" should read -- polySiGe --.

Column 7,
Line 6, cancel the text "wherein".

Signed and Sealed this

Fifth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,800,905 B2
DATED : October 5, 2004
INVENTOR(S) : David M. Fried, Edward J. Nowak and Jed H. Rankin It is certified that error appears in the above-identified patent and that said Letters Patent is hereby corrected as shown below:

Column 6,
Line 2, "700 Âº C." should read -- 700ºC --;
Line 6, cancel the text "about 850 Âº to about 1000 Âº C." and insert the following text -- about 850ºC to about 1000ºC --;
Line 35, "body" should read -- body; --
Line 41, "lapper" should read -- upper --;
Line 44, "An" should read -- an --.
Line 47, "get" should read -- gate --;
Line 52, "polySiGc" should read -- polySiGe --.

Column 7,
Line 6, cancel the text "wherein".

This certificate supersedes Certificate of Correction issued April 5, 2005.

Signed and Sealed this

Twenty-eighth Day of June, 2005

JON W. DUDAS
*Director of the United States Patent and Trademark Office*